United States Patent
You et al.

(10) Patent No.: US 12,056,371 B2
(45) Date of Patent: Aug. 6, 2024

(54) MEMORY DEVICE HAVING REDUCED POWER NOISE IN REFRESH OPERATION AND OPERATING METHOD THEREOF

(71) Applicant: SAMSUNG ELECTRONICS CO., LTD., Suwon-si (KR)

(72) Inventors: Jungmin You, Suwon-si (KR); Seongjin Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 82 days.

(21) Appl. No.: 17/982,099

(22) Filed: Nov. 7, 2022

(65) Prior Publication Data

US 2023/0168818 A1 Jun. 1, 2023

(30) Foreign Application Priority Data

Dec. 1, 2021 (KR) .................. 10-2021-0170368
Apr. 11, 2022 (KR) .................. 10-2022-0044757

(51) Int. Cl.
   G06F 12/00 (2006.01)
   G06F 3/06 (2006.01)

(52) U.S. Cl.
   CPC .......... *G06F 3/0625* (2013.01); *G06F 3/0653* (2013.01); *G06F 3/0673* (2013.01)

(58) Field of Classification Search
   CPC ....... G06F 3/0619; G06F 3/064; G06F 3/0679
   USPC ........................................... 711/154
   See application file for complete search history.

(56) References Cited

U.S. PATENT DOCUMENTS

| | | |
|---|---|---|
| 9,032,141 B2 | 5/2015 | Bains et al. |
| 9,190,137 B2 | 11/2015 | Kim et al. |
| 9,236,110 B2 | 1/2016 | Bains et al. |
| 9,431,092 B2 | 8/2016 | Lim |
| 10,090,039 B2 | 10/2018 | Doo et al. |
| 10,157,658 B2 | 12/2018 | Jung |
| 10,424,362 B2 | 9/2019 | Nakaoka |
| 10,685,696 B2 | 6/2020 | Brown et al. |
| 10,818,336 B2 | 10/2020 | Alzheimer |
| 2007/0025172 A1* | 2/2007 | Miyamoto ........ G11C 11/40603 365/222 |
| 2008/0137463 A1* | 6/2008 | Ishikawa ........... G11C 11/40618 365/230.03 |
| 2011/0225355 A1* | 9/2011 | Kajigaya ............... G11C 11/407 711/E12.001 |
| 2021/0035625 A1 | 2/2021 | Okuno |

* cited by examiner

*Primary Examiner* — Mardochee Chery
(74) *Attorney, Agent, or Firm* — Sughrue Mion, PLLC

(57) ABSTRACT

The present disclosure provides methods, apparatuses, and systems having reduced power noise in a refresh operation. In some embodiments, an operating method includes: performing, in response to receiving a first refresh command, a first normal refresh, at a first refresh timing, in which first N word lines of a plurality of word lines are simultaneously refreshed, and a first target refresh, at a second refresh timing, on at least one first victim word line that is adjacent to a maximum activated word line that is most frequently activated from among the plurality of word lines; and performing, in response to receiving a second refresh command, a second normal refresh, at a third refresh timing, in which second N word lines are simultaneously refreshed, and a second target refresh, at a fourth refresh timing, on at least one second victim word line that is adjacent to the maximum activated word line.

20 Claims, 13 Drawing Sheets

FIG. 4A

| MEMORY CAPACITY | 8Gb | 12Gb | 16Gb | 24Gb |
|---|---|---|---|---|
| BA num/BG | 4 | 4 | 4 | 4 |
| NUMBER OF BG | 4 | 4 | 4 | 4 |
| NUMBER OF WL | 32K | 48K | 64K | 96K |

FIG. 4B

| CMD | C_Ref1 | C_Ref2 | C_Ref3 | C_Ref4 |
|---|---|---|---|---|
| N:N | 2 : 2 | 2 : 2 | 2 : 2 | 2 : 2 |
| N:N & T:T | 4 : ④ | ① : 1 | 4 : ④ | ① : 1 |
| Proposed (N:T) | 4 : 1 | 4 : 1 | 4 : 1 | 4 : 1 |

(8 Gb case)

FIG. 8

| CMD | | C_Ref1 | C_Ref2 | C_Ref3 | C_Ref4 |
|---|---|---|---|---|---|
| N:N & T:T | BA1 | 4 : 4 | 1 : 1 | 4 : 4 | 1 : 1 |
| | BA2 | 4 : 4 | 1 : 1 | 4 : 4 | 1 : 1 |
| Proposed (N:T) | BA1 | 4 : 1 | 4 : 1 | 4 : 1 | 4 : 1 |
| | BA2 | 1 : 4 | 1 : 4 | 1 : 4 | 1 : 4 |

FIG. 9

| CMD | C_Ref1 | C_Ref2 | C_Ref3 | C_Ref4 |
|---|---|---|---|---|
| N:N | 4 : 4 | 4 : 4 | 4 : 4 | 4 : 4 |
| N:T (1:1) | 8 : 8 | 1 : 1 | 8 : 8 | 1 : 1 |
| Proposed (N:T=2:1) | 4 : 1 : 4 | 4 : 1 : 4 | 4 : 1 : 4 | 4 : 1 : 4 |

MEMORY DEVICE HAVING REDUCED POWER NOISE IN REFRESH OPERATION AND OPERATING METHOD THEREOF

CROSS-REFERENCE TO RELATED APPLICATIONS

This application claims benefit of priority under 35 U.S.C. § 119 to Korean Patent Application No. 10-2021-0170368, filed on Dec. 1, 2021 and Korean Patent Application No. 10-2022-0044757, filed on Apr. 11, 2022, in the Korean Intellectual Property Office, the disclosures of which are incorporated by reference herein in their entireties.

BACKGROUND

1. Field

The present disclosure relates to a memory device and an operating method thereof, and in particular, to a memory device having reduced power noise in a refresh operation and an operating method thereof.

2. Description of Related Art

Related memory devices used in high-performance electronic systems may have increased integration density and speed. When a frequency of accessing certain memory cells is increased in a related memory device, such as, but not limited to, a dynamic random access memory (DRAM), stress may be applied to adjacent memory cells. Accordingly, data retention characteristics of the adjacent memory cells may degrade and data reliability may also degrade. For example, when a certain word line is intensively activated, data retention characteristics of memory cells connected to one or more word lines that are adjacent to the certain word line may degrade, and thus, a target refresh may be performed on the adjacent word lines in order to secure data reliability.

However, as the integration density of the memory device increases, the number of word lines that have to be refreshed increases. In this case, because there is a limitation in the number of refresh performing timings within a refresh cycle required by the DRAM specification and the target refresh needs to be additionally performed within the refresh cycle, a significant quantity of word lines may be simultaneously refreshed within a certain time period, which may result in an increase of the power noise.

SUMMARY

The present disclosure provides a memory device having reduced power noise by optimally performing normal refresh and target refresh operations on a plurality of word lines, and an operating method thereof.

According to an aspect of the present disclosure, an operating method of a memory device includes performing, at a first refresh timing in response to reception of a first refresh command, a first normal refresh in which first N word lines, from among a plurality of word lines of the memory device, are simultaneously refreshed. N is an integer greater than 1. The operating method further includes performing, at a second refresh timing in response to the reception of the first refresh command, a first target refresh on at least one first victim word line that is adjacent to a most-frequently activated word line from among the plurality of word lines. The operating method further includes performing, at a third refresh timing in response to reception of a second refresh command, a second normal refresh in which second N word lines, from among the plurality of word lines, are simultaneously refreshed. The operating method further includes performing, at a fourth refresh timing in response to the reception of the second refresh command, a second target refresh on at least one second victim word line that is adjacent to the most-frequently activated word line.

In some embodiments, the at least one first victim word line may include a word line that is closest to a side of the most-frequently activated word line, and the at least one second victim word line may include a word line that is closest to another side of the most-frequently activated word line.

In some embodiments, the at least one first victim word line may include at least two word lines that are adjacent to a side of the most-frequently activated word line, and the at least one second victim word line may include another at least two word lines that are adjacent to another side of the most-frequently activated word line.

In some embodiments, the most-frequently activated word line may correspond to the most frequently activated from among the plurality of word lines in a time interval in which two refresh commands are received.

In some embodiments, the performing of the first normal refresh may include simultaneously refreshing the first N word lines in a first bank of the memory device, and the performing of the first target refresh on the at least one first victim word line may include performing the first target refresh on the at least one first victim word line in a second bank of the memory device.

In some embodiments, the performing of the second normal refresh may include performing of the second normal refresh on the second N word lines in the second bank of the memory device, and the performing of the second target refresh on the at least one second victim word line may include performing the second target refresh on the at least one second victim word line in the first bank of the memory device.

In some embodiments, a refresh section may correspond to a time interval in which refresh operations are performed in response to the reception of the first refresh command, the performing of the first normal refresh may include performing the first normal refresh in the refresh section, and the performing of the first target refresh may include performing the first target refresh in the refresh section.

In some embodiments, the performing of the first normal refresh may include simultaneously refreshing the first N word lines, N being a multiple of 4, and the performing of the first target refresh may include performing the first target refresh on one first victim word line.

According to an aspect of the present disclosure, a memory device includes a memory cell array including a plurality of word lines, a refresh controller, and a control logic. The refresh controller is configured to control refresh operations on the plurality of word lines, and perform scheduling of a normal refresh operation and a target refresh operation on the plurality of word lines. The control logic is configured to determine at least one victim word line on which the target refresh operation is to be performed, based on counting a number of activation times of the plurality of word lines. The refresh controller is further configured to perform scheduling so that the normal refresh operation and the target refresh operation are performed together in a refresh section that corresponds to reception of a refresh command. A first number of word lines that are simultaneously refreshed by the normal refresh operation is greater than a second number of word lines that are refreshed by the target refresh operation.

In some embodiments, the refresh controller may be further configured to perform N-series refresh in the refresh section comprising N refresh timings that corresponds to the reception of the refresh command. N may be an integer greater than 1. A first number of normal refresh operations performed in the refresh section may match a second number of target refresh operations performed in the refresh section.

In some embodiments, performing the target refresh operation in the refresh section may include to refresh the at least one victim word line that is adjacent to a side of a word line that is most frequently activated in a certain time period.

In some embodiments, the refresh controller may be further configured to perform a next target refresh operation on another at least one victim word line adjacent to another side of the word line that is most frequently activated in the certain time period. The next target refresh operation may be scheduled in a next refresh section corresponding to a next refresh command.

In some embodiments, the refresh controller may be further configured to generate a normal address indicating the first number of word lines that are to be refreshed by the normal refresh operation, receive, from the control logic, a target address indicating the at least one victim word line, output the normal address at a first timing of performing the normal refresh operation; and output the target address at a second timing of performing the target refresh operation.

In some embodiments, the memory cell array may include a first bank and a second bank, the refresh section may include a first refresh timing and a second refresh timing, to perform scheduling of the normal refresh operation may include to schedule the normal refresh operation to perform, in the first refresh timing, the normal refresh operation on a first plurality of word lines in the first bank, and to perform scheduling of the target refresh operation may include to schedule the target refresh operation to perform, in the first refresh timing, the target refresh operation on the at least one victim word line in the second bank.

In some embodiments, the refresh controller may be further configured to perform, in the second refresh timing, another target refresh operation on another at least one victim word line in the first bank, and perform, in the second refresh timing, another normal refresh operation on a second plurality of word lines in the second bank.

In some embodiments, the at least one victim word line may be adjacent to a word line that is most frequently activated in a time interval in which two refresh commands are received.

According to an aspect of the present disclosure, a memory system includes a memory device and a memory controller. The memory device includes a memory cell array including a plurality of word lines, and a refresh controller configured to control refresh operations on the plurality of word lines, and schedule a normal refresh operation of the plurality of word lines and a target refresh operation of at least one victim word line. The memory controller is configured to provide the memory device with a command and an address and control access to the memory device. The memory device is configured to perform a scheduling so that the normal refresh operation and the target refresh operation are performed together in a refresh section that corresponds to reception of a refresh command from the memory controller. A first number of word lines that are simultaneously refreshed by the normal refresh operation is greater than a second number of word lines that are refreshed by the target refresh operation.

In some embodiments, the memory device may be further configured to perform the normal refresh operation and the target refresh operation in the refresh section that corresponds to the reception of the refresh command.

In some embodiments, the at least one victim word line may include a first victim word line and a second victim word line that are adjacent to opposite sides of a word line that is most frequently activated in a timing interval, to perform the target refresh operation in the refresh section may include to perform the target refresh operation on the first victim word line, and the memory device may be further configured to perform a next target refresh operation on the second victim word line in a next refresh section corresponding to a reception of a next refresh command.

In some embodiments, the memory controller may be further configured to determine the at least one victim word line based on counting a number of activation times of the plurality of word lines in the memory device, and transmit, to the memory device, the refresh command including a target address indicating the at least one victim word line.

BRIEF DESCRIPTION OF DRAWINGS

Embodiments of the present disclosure may be more clearly understood from the following detailed description taken in conjunction with the accompanying drawings in which:

FIGS. 4A and 4B are diagrams showing an example of a refresh operation, according to an embodiment;

FIG. 8 is a diagram showing an example of a refresh operation in a memory device, according to an embodiment;

FIG. 9 is a diagram showing an example of a refresh operation in a memory device according to another embodiment;

DETAILED DESCRIPTION OF EMBODIMENTS

Figure 1:
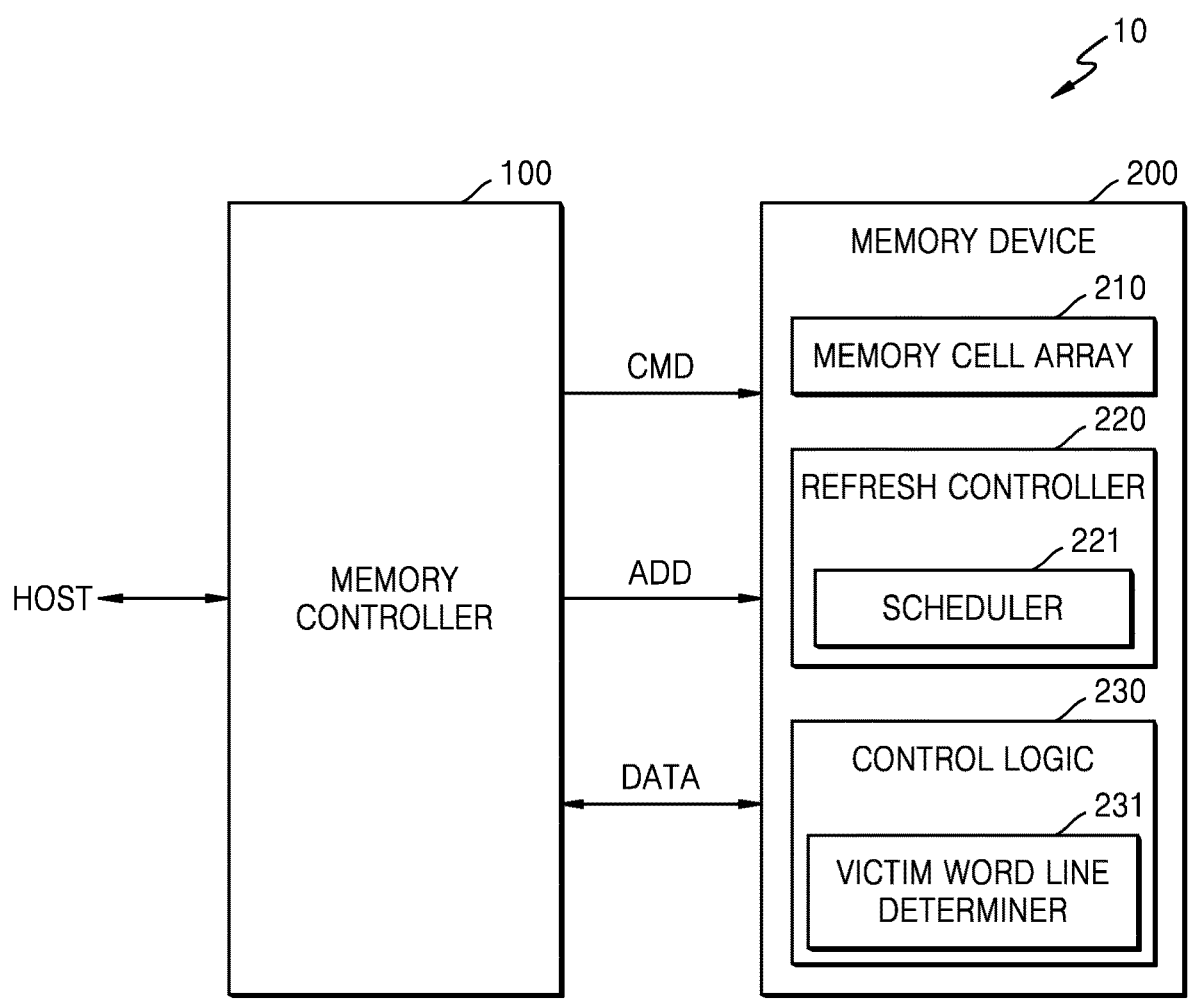
FIG. 1 is a block diagram of a memory system, according to an embodiment.

In the following detailed description, only certain embodiments of the present invention have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive, and like reference numerals designate like elements throughout the specification disclosure. In the flowcharts described with reference to the drawings in this specification disclosure, the operation order may be changed, various operations may be merged, certain operations may be divided, and certain operations may not be performed.

An expression recited in the singular may be construed as singular or plural unless the expression "one", "single", etc., is used. Terms including ordinal numbers such as first, second, and the like, will be used only to describe various components, and are not to be interpreted as limiting these components. The terms may be only used to differentiate one component from others.

It will be understood that, although the terms first, second, third, fourth, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. In embodiments, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

The term "coupled" (or connected) as used throughout the specification of this disclosure (including claims of the present disclosure) may refer to any direct or indirect means of connection. For example, if it is described in the text that a first device is coupled (or connected) to a second device, it should be interpreted that the first device can be directly connected to the second device, or the first device can be indirectly connected to the second device through another device or some other connection means. Terms such as "first" and "second" mentioned in the full text of the description (including claims of the present disclosure) are used to name the elements or to distinguish different embodiments or scopes, rather than to limit the upper or lower limit of the number of elements, nor is it intended to limit the order of the elements. Also, where possible, elements/components/steps denoted by the same reference numerals in the drawings and embodiments represent the same or similar parts. Elements/components/steps that are denoted by the same reference numerals or the same terminology in different embodiments may serve as cross reference for each other.

Hereinafter, one or more embodiments of the present disclosure are described in detail with reference to the accompanying drawings.

FIG. 1 is a block diagram of a memory system 10, according to an embodiment.

Referring to FIG. 1, the memory system 10 may include a memory controller 100 and a memory device 200. The memory device 200 may include a memory cell array 210, a refresh controller 220, and a control logic 230. Alternatively or additionally, according to an embodiment, the control logic 230 may include a victim word line determiner 231. The control logic 230 may further include elements for controlling a memory operation, other than the victim word line determiner 231. That is, the control logic 230 may include various kinds of elements in the memory device 200.

The memory controller 100 may provide the memory device 200 with various signals via an interface circuit (not shown) and control memory operations such as, but not limited to, recording, reading, and the like. For example, the memory controller 100 may provide the memory device 200 with a command signal CMD and an address signal ADD to access data signal DATA in the memory cell array 210. The command signal CMD may include a command for normal memory operations such as, but not limited to, data recording, reading, and the like. Alternatively or additionally, when the memory device 200 includes a dynamic random access memory (DRAM), the command signal CMD may include a refresh command for various operations exclusive for the DRAM (e.g., refreshing of memory cells).

The memory controller 100 may access the memory device 200 according to a request from a host HOST. The memory controller 100 may communicate with the host HOST by using various protocols. The memory cell array 210 may include a plurality of memory cells. For example, the memory cell array 210 may include a plurality of word lines, to each of which a plurality of memory cells may be connected. In an embodiment, the memory cells connected to one word line may be referred to as a row. That is, the memory cell array 210 may include a plurality of rows. When describing the embodiments, performing a refresh on a word line may denote that a refresh is performed with respect to memory cells (or row) connected to one word line, and accordingly, terms such as, but not limited to, refresh on word line, refresh on row, and the like may be used jointly.

According to an embodiment, when a certain word line is intensively or frequently activated (or accessed), memory cells of a word line (hereinafter, referred to as a victim word line) adjacent to the frequently activated word line are electromagnetically interfered with, and in particular, as the integration density of the memory device 200 increases, the degree of interference applied to the victim word line may also increase. Accordingly, data in the memory cells connected to the victim word line may be likely to be flipped. In addition, in order to secure data reliability in correspondence with the above issue, a target refresh on the victim word line may be performed regularly or irregularly.

Alternatively or additionally, the plurality of word lines may be arranged parallel to one another in the memory cell array 210, and two word lines adjacent to the word line that is intensively accessed may correspond to the victim word lines. Alternatively or additionally, in an embodiment, at least two word lines adjacent to one side of the intensively accessed word line may correspond to the victim word lines, and accordingly, three or more word lines may be determined as the victim word lines regarding the intensively accessed word line.

In addition, the refresh controller 220 may perform the refresh on the word lines (or rows) in the memory cell array 210 in response to a refresh command from the memory controller 100. Alternatively or additionally, the refresh controller 220 may refresh the word lines in the memory cell array 210 without an intervention of the memory controller 100 in a self-refresh mode. In addition, according to an embodiment, when a certain word line is intensively accessed, the refresh controller 220 may control a target refresh operation on one or more victim word lines that are adjacent to the intensively accessed word line based on the control of the control logic 230.

In an embodiment, the victim word line determiner 231 may determine the word line that has been most frequently activated within a certain cycle based on a result of determining the number of activation times with respect to a plurality of word lines, and may determine positions of one or more victim word lines that are adjacent to the most frequently activated word line. Alternatively or additionally, information about the determined victim word lines may be provided to the refresh controller 220. However, some embodiments are not limited thereto, and the elements for determining the victim word lines may be variously implemented in the memory device 200, for example, the elements for determining the victim word lines may be implemented outside the control logic 230.

According to an embodiment, the refresh controller 220 may control a normal refresh operation and a target refresh operation. For example, the command signal CMD from the memory controller 100 may include a refresh command, and the refresh controller 220 may selectively perform the normal refresh operation and the target refresh operation in response to the refresh command. The refresh controller 220 may include a scheduler 221, and the scheduler 221 may perform scheduling of the normal refresh operation and the target refresh operation.

According to an embodiment, the memory device 200 may perform the refresh operation at least twice in response to one refresh command from the memory controller 100. For example, when the refresh operation is performed at N timings in response to one refresh command, this may be referred to as N-series refresh. For example, a temporal section (e.g., refresh section) in which the refresh is performed in response to one refresh command may be defined as a parameter tRFC, and N-times of refresh operations may be sequentially performed within the refresh section tRFC. Alternatively or additionally, the word lines in the memory device 200 may need to be refreshed at least once within a certain refresh cycle, and an interval of receiving the refresh command from the memory controller 100 (e.g., refresh reception interval) may be defined as a parameter tREFI.

When a plurality of word lines are simultaneously refreshed or the refresh operations are concentrated on a significant quantity of word lines within a short time period, the power noise may increase and may result in degradation of data reliability. However, according to an embodiment, a scheduling operation may be performed so that the normal refresh operation and the target refresh operation may be performed at appropriate timings, and accordingly, the power noise may be reduced. For example, when the memory device 200 performs the N-series refresh, based on the scheduling operation, the normal refresh operation may be performed at some refresh timings and the target refresh operation may be performed at some other refresh timings in response to one refresh command.

In the memory device 200, the refresh cycle having a certain time is set in order to improve the data retention characteristic, and as the integration density of the memory device 200 is improved, the number of word lines included in the memory device 20 may be increased. In this case, a plurality of word lines may be simultaneously normal-refreshed at one refresh timing. Alternatively or additionally, in case of the target refresh operation, the refresh operation may be selectively performed with respect to one or two victim word lines adjacent to one word line, and thus, one or relatively small number of word lines may be refreshed at one refresh timing. In the embodiment, because the normal refresh and the target refresh may be simultaneously performed during one refresh section tRFC, refreshing of a significant quantity of word lines during short period of time due to continuous normal refresh operations performed during one refresh section tRFC may be reduced or prevented, and accordingly, the power noise may be reduced.

In the above embodiment, a criterion of determining victim word lines includes an operation of determining the word line that is most frequently activated during a certain section, but some embodiments are not limited thereto. The victim word line may be determined based on various criteria, for example, a word line that is successively activated a certain reference number of times or greater, and one or more word lines adjacent to the word line that is successively activated may be determined as the victim word lines.

In addition, the refresh controller 220 may include a counter (not shown) that generates an address (e.g., normal address) for indicating the word line on which the normal refresh is to be performed. The scheduler 221 may receive an address (e.g., target address) for indicating the victim word line on which the target refresh is to be performed from the control logic 230, along with the normal address. In addition, based on the control of the control logic 230, the scheduler 221 may output normal refresh at the timing of performing the normal refresh and may output the target refresh at the timing of performing the target refresh.

As the target refresh on the victim word line is performed, the number of times of performing the normal refresh in one refresh cycle may be reduced. As the normal refresh is performed on a significant quantity of word lines during a certain time period (e.g., short period of time), the power noise may be increased. However, according to the embodiment, cases in which a significant quantity of word lines are refreshed within a short period of time may be reduced, and the data reliability may be effectively improved in correspondence with the power noise.

Alternatively or additionally, the memory device 200 may include a DRAM such as, but not limited to, a double data rate synchronous dynamic random access memory (DDR SDRAM), a lower power double data rate (LPDDR) SDRAM, a graphics double data rate (GDDR) SDRAM, a Rambus dynamic random access memory (RDRAM), and the like. However, some embodiments are not limited thereto, for example, the embodiments may be applied to a memory device 200 that may perform a data retention operation corresponding to the refresh operation (e.g., a non-volatile memory such as, but not limited to, a magnetic RAM (MRAM), a ferroelectric RAM (FeRAM), a phase change RAM (PRAM), a resistive RAM (ReRAM), and the like).

In an embodiment, the memory device 200 may include one memory chip or a semiconductor package including two or more memory chips. Alternatively or additionally, the memory device 200 may include a memory module in which a plurality of memory chips are mounted on a module board. Alternatively or additionally, as shown in FIG. 1, the memory controller 100 and the memory device 200 may be separate components, but the memory device 200 of an embodiment may be implemented as a memory system in which a memory controlling function and a memory cell array are integrated in one semiconductor package.

Figure 2:
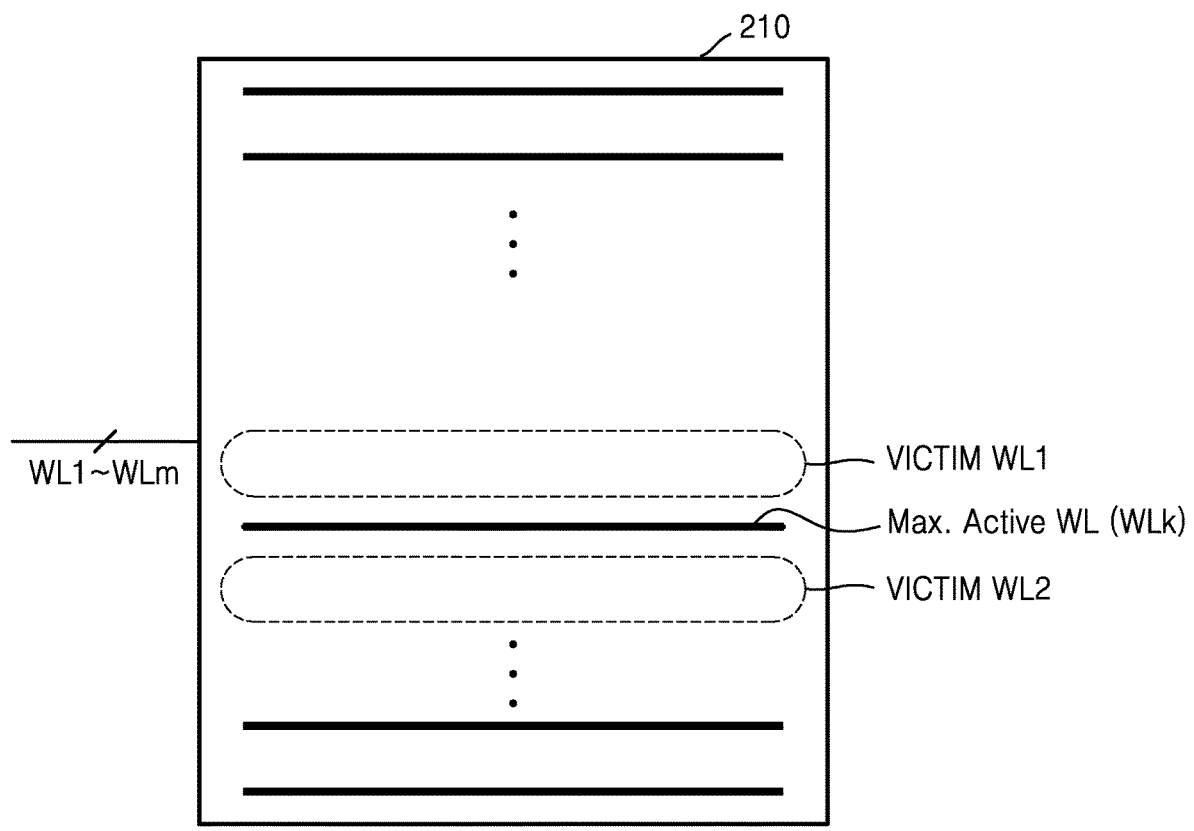
FIG. 2 is a diagram showing an example of a victim word line on which a target refresh is performed, according to an embodiment.

FIG. 2 is a diagram showing an example of a victim word lines on which a target refresh is performed, according to an embodiment.

Referring to FIG. 2, the memory cell array 210 includes a plurality of word lines WL1 to WLm, where m is an integer greater than 1. The memory cell array 210 may determine, from among the plurality of word lines WL1 to WLm, a word line that is most frequently activated according to a certain cycle. When it is assumed that a k-th word line WLk is the word line that is most frequently activated, at least one word line adjacent to the k-th word line may be affected by a large electromagnetic interference, and accordingly, the at least one adjacent word line may correspond to the victim word line.

Victim word lines may be located on opposite sides of the k-th word line WLk, for example, a victim word line located at one side of the k-th word line WLk may be referred to as a first victim word line weak WL1 and a victim word line located at the other side of the k-th word line WLk may be referred to as a second victim word line weak WL2. In an embodiment, one word line located at one side of the k-th word line WLk may be determined as the victim word line, and in this case, the first victim word line weak WL1 may include one word line. Alternatively or additionally, two or more word lines located at one side may be determined as the victim word lines, and in this case, the first victim word line weak WL1 may include two or more word lines.

In an embodiment, the target refresh may be performed on one word line at one refresh timing. Alternatively or additionally, when N-times of refreshes are performed in response to one refresh command from the memory controller 100 (where N is 2 or greater integer), some of the N-times of refreshes may correspond to the target refreshes. Accordingly, successive normal refreshes corresponding to one refresh command may be prevented or reduced, and because the intensive refreshing of a significant quantity of word lines during the short period of time is prevented, the power noise may be reduced.

Figure 3:
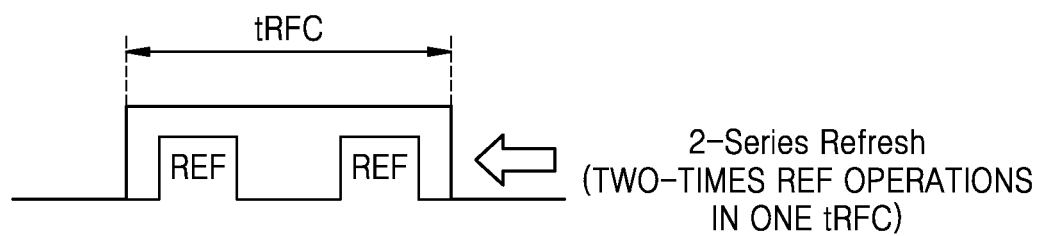
FIG. 3 is a diagram schematically showing 2-series refresh, according to an embodiment.

FIG. 3 is a diagram schematically showing two-series refresh, according to an embodiment.

Referring to FIG. 3, a plurality of refresh commands may be provided from the memory controller 100 to the memory device 200 in one refresh cycle, and as various parameters defined in the DRAM specification, the refresh section tRFC may correspond to the time section in which the refresh is performed in the memory device 200 in response to one refresh command. When two times of refresh operations are performed because there are two times of refresh timings in one refresh section tRFC, the memory device 200 may be referred to as performing two-series refresh operation. For example, whenever the refresh command is transmitted from the memory controller, the memory device 200 may determine arbitrary two time points where the refresh is to be performed in the refresh section tRFC defined by a certain parameter, and may include an element such as, but not limited to, a counter circuit (not shown), for example, for determining the corresponding time points.

In an embodiment, the memory device 200 may perform various kinds of refresh operations in one refresh section tRFC. For example, the refresh operation may include the normal refresh operation that is sequentially performed with respect to the plurality of word lines, and the target refresh operation selectively performed with respect to certain word lines. Alternatively or additionally, information on word lines having relatively low data retention characteristics may be stored in advance in the memory system during processes of manufacturing or testing the memory device, and the refresh operation may further include a refresh operation with respect to the word line having a low characteristic (e.g., may be referred to as a care refresh with respect to a defective word line). For example, the memory device 200 of the embodiment may perform at least two kinds of refresh operations from among the above-described various kinds of refresh operations in one refresh section tRFC.

In an embodiment, when the memory device 200 performs the two-series refresh operation, the normal refresh and the target refresh may be performed together in response to one refresh command from the memory controller. Alternatively or additionally, in an embodiment, the memory device 200 may perform the normal refresh and the care refresh together in response to one refresh command from the memory controller. In addition, the memory device 200 may perform various kinds of refresh operations, and at least two kinds of refresh operations selected from among the various kinds of refresh operations may be performed together in one refresh section tRFC.

FIGS. 4A and 4B are diagrams showing an example of a refresh operation, according to an embodiment.

The number of word lines included in the memory device 200 may vary depending on the capacity of the memory device 200. For example, as shown in FIG. 4A, a DRAM chip including a DRAM cell as the memory device 200 may have a capacity of 8 Gigabits (Gb), 12 Gb, 16 Gb, or 24 Gb. In an example, the memory cell array of the DRAM chip includes a plurality of bank groups BG, each bank group BG may include four banks BA, and in each bank, different numbers of word lines may be arranged depending on the memory capacity of the DRAM chip. In an example, when the DRAM chip has a capacity of 8 Gb, 32K word lines may be arranged in one bank. In another example, when the DRAM chip has a capacity of 12 Gb, 48K word lines may be arranged. In another example, when the DRAM chip has a capacity of 16 Gb, 64K word lines may be arranged. In yet another example, when the DRAM chip has a capacity of 24 Gb, 96K word lines may be arranged.

When it is assumed that the refresh cycle of the memory device 200 is defined as 64 milliseconds (ms) and 8K refresh commands are provided from the memory controller 100 to the memory device 200 during the refresh cycle according to the refresh command reception interval tREFI, 16K-times of refresh operations may be performed during one refresh cycle when the memory device 200 performs the two-series refresh. Here, when 32K word lines are arranged in each bank because the memory capacity is 8 Gb, two word lines need to be refreshed in every refresh operation (e.g., normal refresh operation).

In addition, when the memory device 200 performs the target refresh according to the above embodiment, the target refresh may be performed in some of the 16K refresh operations. For example, when the normal refresh operation and the target refresh operation are performed in a ratio of 1:1, the normal refresh operation and the target refresh operation may be respectively 8K times in one refresh cycle, respectively. In this case, in order to perform the normal refresh operation with respect to the 32K word lines, four word lines need to be refreshed in each normal refresh operation.

FIG. 4B shows an example of the refresh operation in the memory device 200 having a capacity of 8 Gb, and shows the example of the refresh operation when first to fourth refresh commands C_Ref1 to C_Ref4 are received. The first row of FIG. 4B shows an example in which a normal refresh operation N is only performed without performing a target refresh operation T, the second row of FIG. 4B shows an example in which the target refresh operation T and the normal refresh operation N are performed when the embodiment is not applied, and the third row of FIG. 4B shows an example in which the target refresh operation T and the normal refresh operation N are performed according to the embodiment. Also, in the second and third rows in FIG. 4B, it is assumed that the target refresh operation T and the normal refresh operation N are performed in a ratio of 1:1.

As shown in the first row of FIG. 4B, two refresh operations may be performed in response to each of the first to fourth refresh commands C_Ref1 to C_Ref4, and according to the above embodiment, two word lines may be simultaneously refreshed in one refresh operation.

Alternatively, as shown in the second row of FIG. 4B, the same kind of refresh operation is only performed in response to each refresh command, and the target refresh is performed at the refresh operation timings corresponding to half the plurality of refresh operations included in one refresh operation. Accordingly, the refresh operation may be performed with respect to four word lines at the same time in one normal refresh operation N. Alternatively or additionally, the time interval (2×tREFI) between the reception of two refresh commands may correspond to a unit of determining the most frequently activated word line. Two word lines adjacent to opposite sides of the most frequently activated word line may be determined as the victim word lines, and during the cycle of determining the most frequently activated word line, the target refresh with respect to two victim word lines may be performed.

For example, two normal refresh operations may be performed in response to the first refresh command C_Ref1, and four word lines may be simultaneously refreshed in each normal refresh operation. After that, two target refresh operations may be performed in response to the second refresh command C_Ref2, and one victim word line may be refreshed in each target refresh operation. The above normal refresh operation N and the target refresh operation T may be alternately performed every time the refresh command is received.

In addition, according to the embodiment shown in the third row of FIG. 4B, the normal refresh operation N and the target refresh operation T may be performed together in response to one refresh command. For example, in response to the first refresh command C_Ref1, four word lines are simultaneously normal refreshed at the first refresh timing, and then, at the next refresh timing, the target refresh operation T with respect to one victim word line may be performed. Similarly, four word lines are simultaneously normal refreshed in response to the second refresh command C_Ref2, and then, the target refresh operation T with respect to one victim word line may be performed. In addition, an example in which the normal refresh operation N is performed first and then the target refresh operation T is performed in response to each refresh command is shown, but in an embodiment, the normal refresh operation N may be performed after performing the target refresh operation T.

According to the embodiment, the case in which the number of word lines that are refreshed during the relatively short period of time (e.g., refresh section) is rapidly increased may be reduced, for example, as shown in the third row of FIG. 4B, the number of word lines that are simultaneously refreshed may be uniformed, and as such, the power noise may be reduced. Alternatively or additionally, in the embodiment, when the memory device 200 has a capacity of a certain level or greater, a large number of word lines corresponding to multiples of 4 may be simultaneously normal refreshed at one refresh timing, but the case in which the normal refresh is performed successively within the relatively short time period may be reduced, to thereby reduce the power noise.

Figure 5:
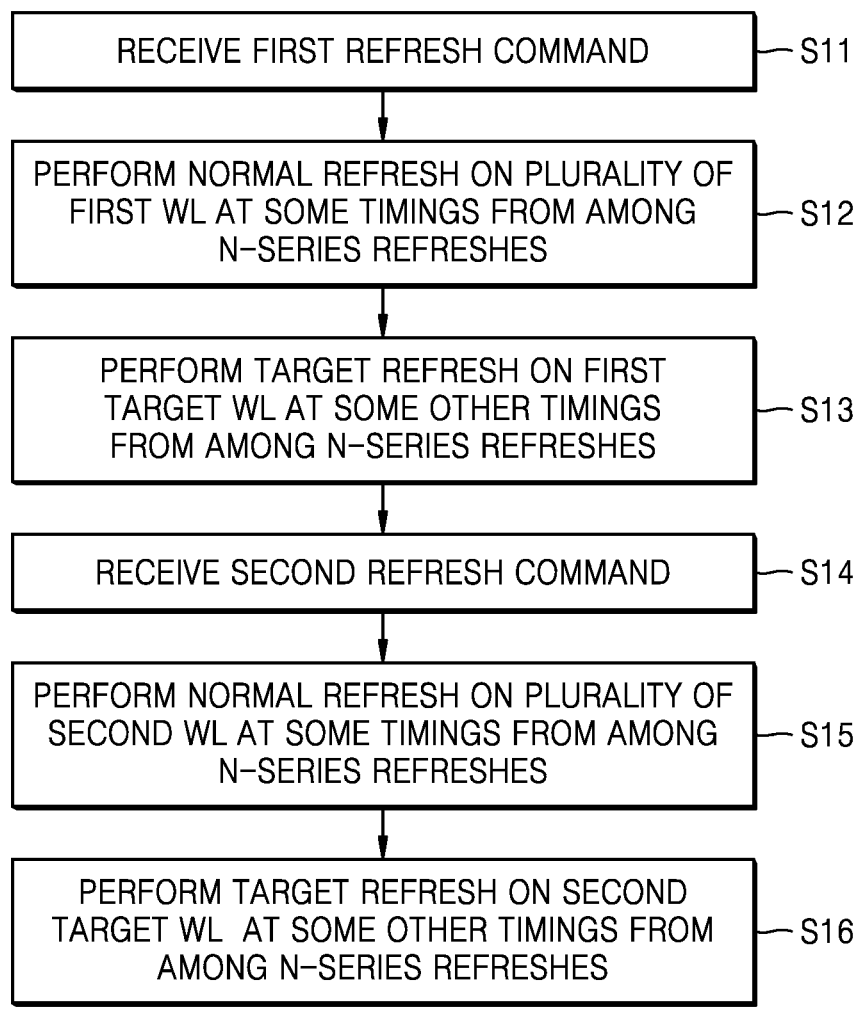
FIG. 5 is a flowchart for describing an operating method of a memory device, according to an embodiment.

FIG. 5 is a flowchart for describing an operating method of a memory device, according to an embodiment.

Referring to FIG. 5, the memory device 200 may regularly receive the refresh command from the memory controller. For example, the memory device 200 may receive a first refresh command (S11). The memory device 200 may perform N-series refresh in response to reception of each refresh command, for example, the normal refresh with respect to a plurality of first word lines may be performed at each of some timings from among the N-times of refresh timings responding to the first refresh command (S12). In addition, the target refresh with respect to a first target word line may be performed at each of some other timings from among the N-times of refresh timings (S13), for example, the first target word line may include at least one word line.

The memory device 200 may receive a second refresh command from the memory controller 100 (S14), and the normal refresh with respect to a plurality of second word lines may be performed at each of some timings from among the N-times of refresh timings corresponding to the reception of the second refresh command (S15). In addition, the target refresh with respect to a second target word line may be performed at each of some other timings from among the N-times of refresh timings (S16).

In an embodiment, the normal refresh operation may be performed based on a normal address that indicates the plurality of word lines sequentially, and the normal address may be generated based on a counting operation. In addition, the plurality of first word lines may include two or more word lines that are spaced apart from each other by a certain number of word lines in any one of the banks in the memory cell array. Accordingly, the plurality of second word lines may include word lines that are adjacent to the first word lines.

Figure 6:
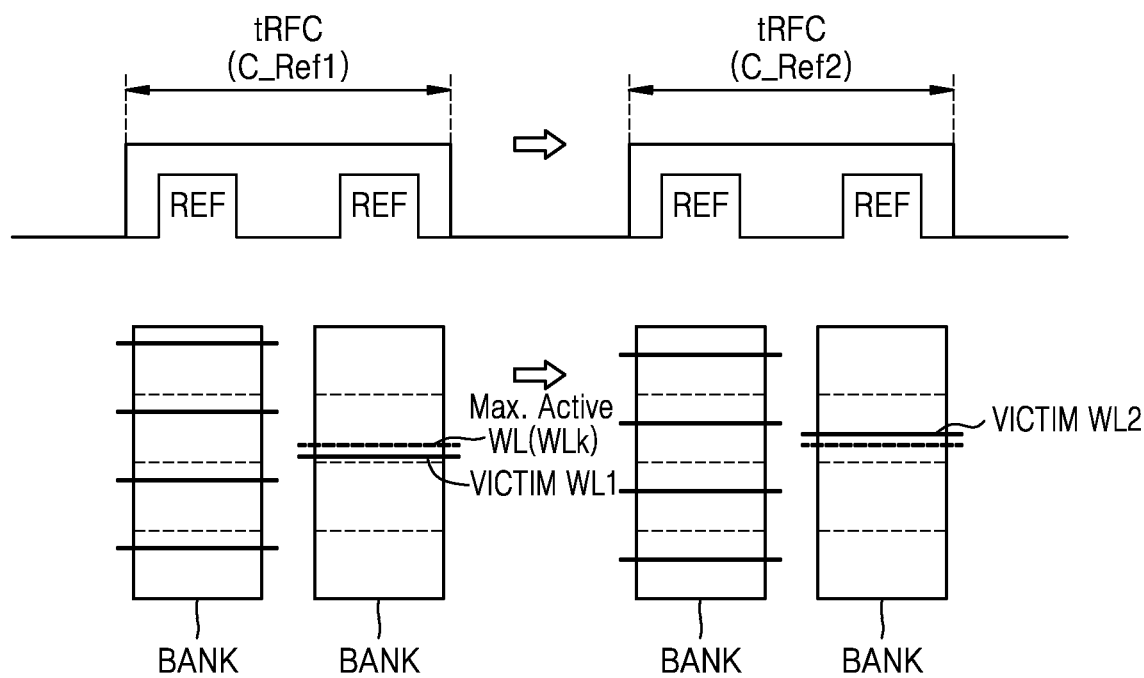
FIG. 6 is a diagram showing an example of a refresh operation in one bank, according to an embodiment.

FIG. 6 is a diagram showing an example of a refresh operation in one bank BANK, according to an embodiment. In FIG. 6, an example in which the memory device 200 performs two-series refresh and performs one normal refresh and one target refresh together in response to each of the refresh commands is shown.

As the first refresh command C_Ref1 is transmitted from the memory controller, the memory device 200 may perform the refresh operation twice in the refresh section tFRC. For example, the normal refresh operation may be performed at a first refresh timing and the target refresh operation may be performed at a second refresh timing. According to the number of word lines included in the memory device, a plurality of word lines may be simultaneously refreshed in the normal refresh operation, for example, an example in which four word lines are simultaneously refreshed at the first refresh timing is shown.

In addition, the most frequently activated word line during a certain time period may be determined, for example, at least two victim word lines may be determined based on the most frequently activated word line determined during a certain period before receiving the first refresh command (e.g., a time period in which two refresh commands are transmitted from the memory controller). When it is assumed that the most frequently activated word line is a k-th word line WLk, the target refresh may be performed with respect to a first victim word line weak WL1 that is adjacent to one side of the k-th word line WLk at the second refresh timing responding to the first refresh command.

In addition, the memory device 200 may receive a second refresh command C_Ref2 from the memory controller, and the normal refresh may be performed at a first refresh timing responding to the second refresh command. For example, the normal refresh is sequentially performed with respect to the word lines based on the address counting, and thus, four word lines that are adjacent to four word lines on which the normal refresh is performed in response to the previous first refresh command may be simultaneously refreshed.

In addition, the target refresh may be performed at a second refresh timing responding to the second refresh command C_Ref2, and the target refresh may be performed with respect to the second victim word line weak WL2 that is adjacent to the other side of the most frequently activated word line (e.g., the k-th word line WLk) determined previously. Because the above target refresh operation is added to the refresh cycle, some word lines may be refreshed at least twice in one refresh cycle.

Figure 7:
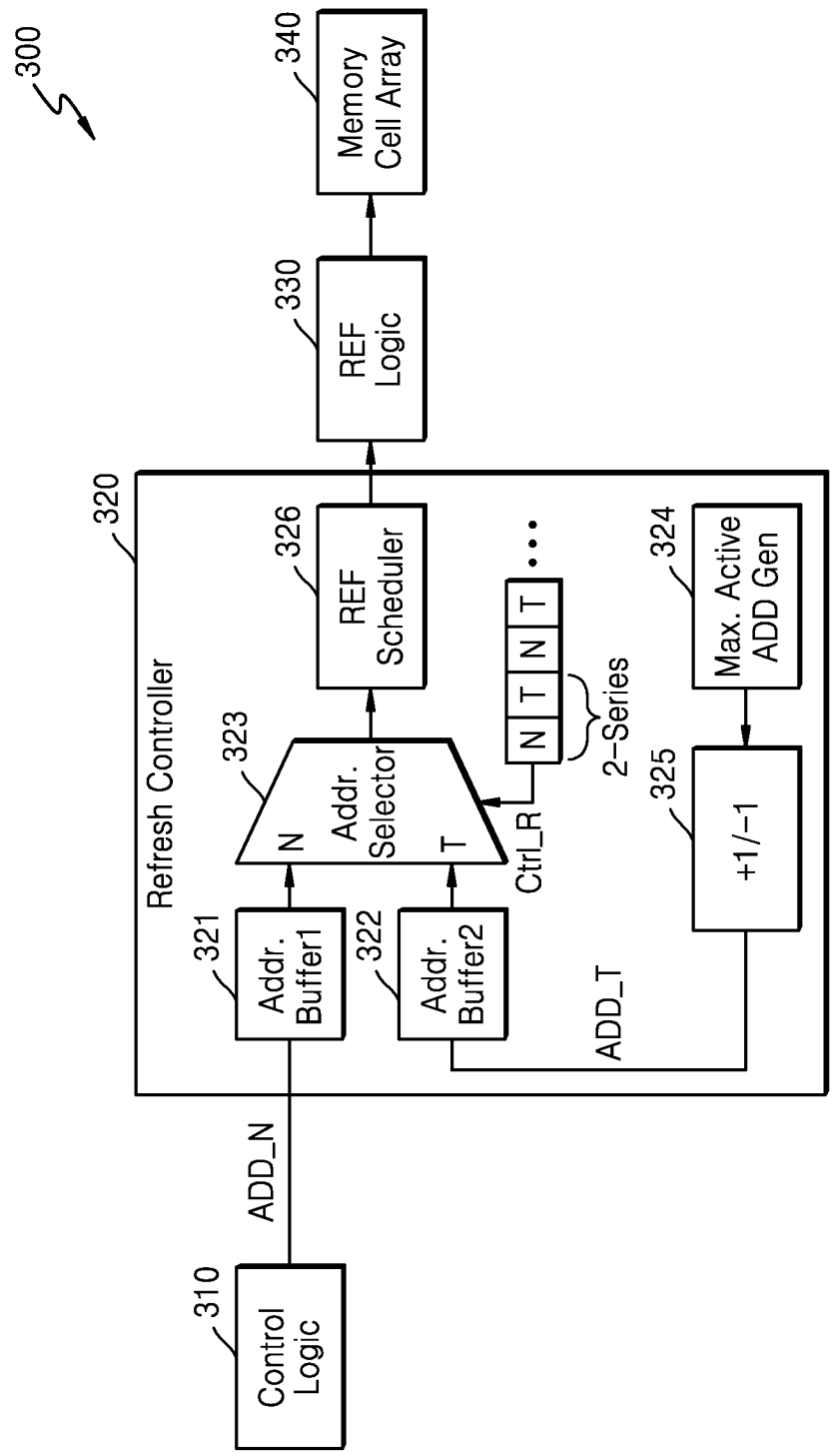
FIG. 7 is a block diagram showing various examples of implementing a memory device, according to various embodiments.

FIG. 7 is a block diagram showing various examples of implementing a memory device 200 according to an embodiment.

Referring to FIG. 7, the memory device 300 may include a control logic 310, a refresh controller 320, a refresh logic 330, and a memory cell array 340. The elements shown in FIG. 7 are about one implementable embodiment, and some of the elements in the refresh controller 320 shown in FIG. 7 may be included in the control logic 310 or may be separately located out of the refresh controller 320. The memory device 300 may include or may be similar in many respects to the memory device 200 described above in reference to FIG. 1 and may include additional features not described above. Furthermore, the control logic 310, the refresh controller 320, the refresh logic 330, and the memory cell array 340 may be similar in many respects to the control logic 230, the refresh controller 220, and the cell array 210, respectively, described above in reference to FIG. 1 and may include additional features not described above.

The control logic 310 may perform the control operation regarding the refresh operation, for example, the control logic 310 may provide the refresh controller 320 with a normal refresh address (or normal address ADD_N) that may be generated based on a counting operation of a counter circuit (not shown) therein. Alternatively or additionally, the refresh controller 320 may include a first address buffer 321, a second address buffer 322, an address selector 323, a maximum active address generator 324, an address converter 325, and a refresh scheduler 326.

The maximum active address generator 324 may include a counter circuit (not shown) therein, that may count the number of times of activating each word line in a certain period, and may generate an address of the word line that is most frequently activated based on the counting result. Alternatively or additionally, the address converter 325 may perform an address converting operation for generating an address of the victim word line that is adjacent to the most frequently activated word line. For example, the address converter 325 may generate a target address ADD_T indicating the victim word line that is adjacent to one side of the most frequently activated word line by adding 1 to the address of the most frequently activated word line. Alternatively or additionally, the address converter 325 may generate a target address ADD_T indicating the victim word line adjacent to the other side of the most frequently activated word line by subtracting 1 from the address of the most frequently activated word line. Alternatively or additionally, the normal address ADD_N may be stored in the first address buffer 321, the target address ADD_T may be stored in the second address buffer 322, and the normal address ADD_N and the target address ADD_T may be provided as inputs to the address selector 323.

In an embodiment, the address selector 323 may selectively output the normal address ADD_N and/or the target address ADD_T in response to a refresh control signal Ctrl R. In addition, as the two-series refresh operation is performed based on the embodiments, the address selector 323 may alternately output the normal address ADD_N and the target address ADD_T in one refresh section. The normal address ADD_N and/or the target address ADD_T output from the address selector 323 may be provided to the refresh scheduler 326, and the refresh timing may be scheduled by the refresh scheduler 326. For example, in the memory operation, the refresh operation may be performed prior or delayed a certain time, and the refresh timing may be adjusted according to the control of the refresh scheduler 326.

In an embodiment, the refresh logic 330 may perform an operation of controlling the memory cell array 340 so that the actual refresh may be performed based on the control of the refresh scheduler 326. For example, the refresh logic 330 may perform a control operation for activating the word line at the position indicated by the normal address ADD_N and/or the target address ADD_T.

FIG. 8 is a diagram showing an example of a refresh operation in a memory device 300, according to an embodiment. FIG. 8 shows an example of the refresh operation in which first bank BA1 and second bank BA2 are adjacent to each other. Alternatively or additionally, in the example, the two-series refresh is performed in response to each refresh command, the normal refresh operation N and the target refresh operation T may be performed in a ratio of 1:1, and four word lines are simultaneously refreshed in each normal refresh operation N.

As shown in the first row of FIG. 8, when the embodiment is not applied, the normal refresh operation N may be performed in each of the first bank BA1 and the second bank BA2 in response to the first refresh command C_Ref1. For example, four word lines may be simultaneously refreshed in each bank (e.g., BA1 and BA2) at each of the first and second refresh timings in one refresh section. In this case, at one refresh timing, eight word lines located in the first bank BA1 and the second bank BA2 that are adjacent to each other are simultaneously refreshed. Moreover, sixteen word lines may be refreshed at first and second refresh timings that correspond to a relatively short period of time.

Alternatively or additionally, the target refresh operation T may be performed in each of the first bank BA1 and the second bank BA2 in response to the second refresh command C_Ref2, and at each refresh timing in one refresh section, the target refresh operation T may be performed with respect to one word line in one bank. Similarly, the normal refresh operation N may be performed in each of the first bank BA1 and the second bank BA2 in response to a third refresh command C_Ref3, and the target refresh operation T may be performed in each of the first bank BA1 and the second bank BA2 in response to a fourth refresh command C_Ref4.

According to the above example, in the refresh operation performed in response to each of the first refresh command C_Ref1 and the third refresh command C_Ref3, a significant quantity of word lines may be intensively refreshed within the relatively short period of time, and thus, the performance degradation due to the power noise may occur.

In addition, as shown in the second row of FIG. 8 to which the embodiment is applied, the normal refresh operation N and the target refresh operation T may be performed together in one refresh section. For example, at one refresh timing in one refresh section, the normal refresh of four word lines may be simultaneously performed, and at the other refresh timing, the target refresh of one victim word line may be performed.

In an embodiment, at any one refresh timing, different kinds of refresh operations may be performed with respect to the first bank BA1 and the second bank BA2. For example, at the first refresh timing in response to the first refresh command C_Ref1, the normal refresh operation N is performed in the first bank BA1 and thus four word lines are simultaneously refreshed, and the target refresh operation T is performed in the second bank BA2 and thus one victim word line may be refreshed. Alternatively or additionally, at the second refresh timing in response to the first refresh command C_Ref1, the target refresh operation T is performed in the first bank BA1 and thus one victim word line is refreshed, whereas the normal refresh operation N is performed in the second bank BA2 and thus four word lines may be simultaneously normal-refreshed.

Similarly, with respect to each of the second to fourth refresh commands C_Ref2 to C_Ref4, there may be two refresh timings in response to each refresh command, and the normal refresh operation N is performed in one of the first and second banks BA1 and BA2 whereas the target refresh operation T is performed in the other, at each refresh timing.

According to the above embodiment, different kinds of refresh operations are performed in adjacent banks at the same refresh timing, and accordingly, the number of word lines that are simultaneously refreshed at each refresh timing may be uniformed, and the power noise may be reduced. For example, when the normal refresh operation N in which a plurality of word lines are simultaneously refreshed is applied with respect to a plurality of adjacent banks, the power noise may be increased because a significant quantity of word lines are simultaneously refreshed. However, according to the above-described embodiment, the number of word lines that are simultaneously refreshed at each refresh timing may be reduced.

FIG. 9 is a diagram showing an example of a refresh operation in a memory device 300, according to another embodiment. FIG. 9 shows an example in which three-series refresh is performed in response to each refresh command.

In the first row of FIG. 9, two-series refresh is performed without applying the embodiment and the target refresh operation T is not performed. There are two refresh timings in response to each of the first to fourth refresh commands C_Ref1 to C_Ref4, and the normal refresh operation N may be performed with respect to four word lines at each refresh timing. In addition, in the second row of FIG. 9, two-series refresh is performed without applying the embodiment and the target refresh operation T is performed. In addition, there are two refresh timings responding to each of the first to fourth refresh commands C_Ref1 to C_Ref4, and the normal refresh operation N is only performed in response to any one refresh command whereas the target refresh operation T may be only performed in response to another refresh command. Here, when the normal refresh operation N is performed, eight word lines may be simultaneously refreshed, and when the target refresh operation T is performed, the target refresh may be performed with respect one victim word line.

Alternatively or additionally, when the embodiment is applied as shown in the third row of FIG. 9, there are three refresh timings in one refresh section, and the normal refresh operation N may be performed at some of the three refresh timings and the target refresh operation T may be performed at some other refresh timings. For example, the normal refresh operation N may be performed twice and the target refresh operation T is performed once in response to one refresh command.

The number of times of performing the normal refresh operation N and the number of times of performing the target refresh operation T may be set in a certain ratio, and according to the embodiment, may be set in a ratio of 2:1. In this case, in one example operation, four word lines may be simultaneously refreshed in each normal refresh operation N in response to one refresh command, whereas one victim word line may be refreshed in the target refresh operation T. Alternatively or additionally, in the embodiment, the normal refresh operation N, the target refresh operation T, and the normal refresh operation N may be sequentially performed in response to each refresh command.

According to the above embodiment, the number of word lines that are simultaneously refreshed at each refresh timing may be reduced, and the cases in which a significant quantity of word lines are refreshed successively may be reduced. For example, the refresh command receiving interval may be temporally and relatively longer than one refresh section (e.g., tRFC), and accordingly, a time interval between the normal refresh operation N performed at the third refresh timing in response to the first refresh command C_Ref1 and the normal refresh operation N performed at the first refresh timing in response to the second refresh command C_Ref2 may be relatively long, and thus, the cases in which a significant quantity of word lines are intensively refreshed within a short period of time may be reduced.

Figure 10:
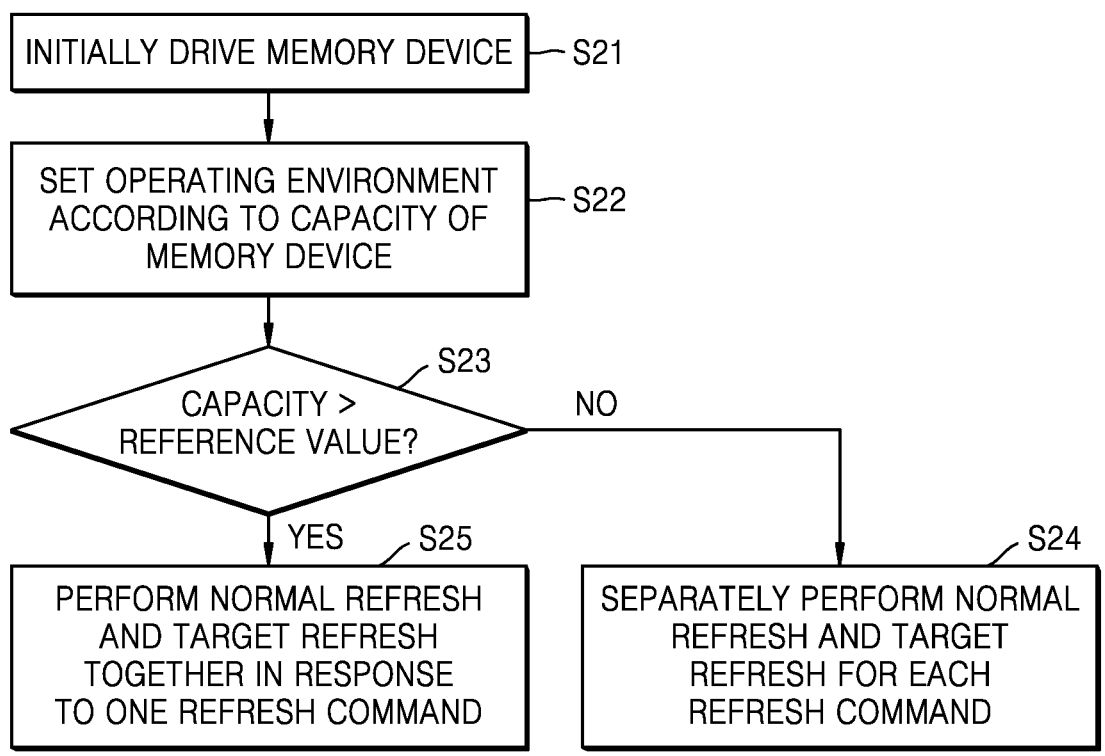
FIG. 10 is a flowchart describing an operating method of a memory system, including a memory device, according to an embodiment.

FIG. 10 is a flowchart for describing an operating method of a memory system, including a memory device (e.g., memory device 200 of FIG. 1 or memory device 300 of FIG. 7), according to an embodiment.

Referring to FIG. 10, as the memory system is initially driven, an initial driving of the memory device 300 included in the memory system is performed (S21), and a mode register set provided in the memory device 300 may store various setting information for setting operation environment of the memory device 300 on the basis of the control of the memory controller. For example, the number of word lines provided in the memory device 300 may vary depending on the capacity of the memory device, and the operation environment according to the capacity of the memory device 300 may be set through the initial driving based on the control from the memory controller 100 (S22).

According to the operation environment setting as described above, the refresh operation may be differently controlled according to whether the capacity of the memory device 300 is greater or less than a reference value (S23). For example, when the capacity of the memory device 300 is greater than a certain reference value, it may represent that the number of word lines provided in the memory device 300 is relatively large, and in this case, the embodiments may be applied to the refresh operation. That is, when there are relatively large number of word lines, the number of word lines that are simultaneously refreshed may be relatively large, and accordingly, the refresh operation may be controlled so that the normal refresh and the target refresh may be performed together in response to one refresh command in order to reduce the power noise (S25).

Alternatively or additionally, when the capacity of the memory device 300 is less than the certain reference value, it may represent that the number of word lines provided in the memory device 300 is relatively small, and in this case, the number of word lines that are simultaneously refreshed is relatively small. Accordingly, the normal refresh and the target refresh may be separately performed in response to one refresh command (S24). For example, a plurality of normal refresh operations may be successively performed in response to one refresh command, and a plurality of target refresh operations may be successively performed in response to another refresh command.

Figure 11:
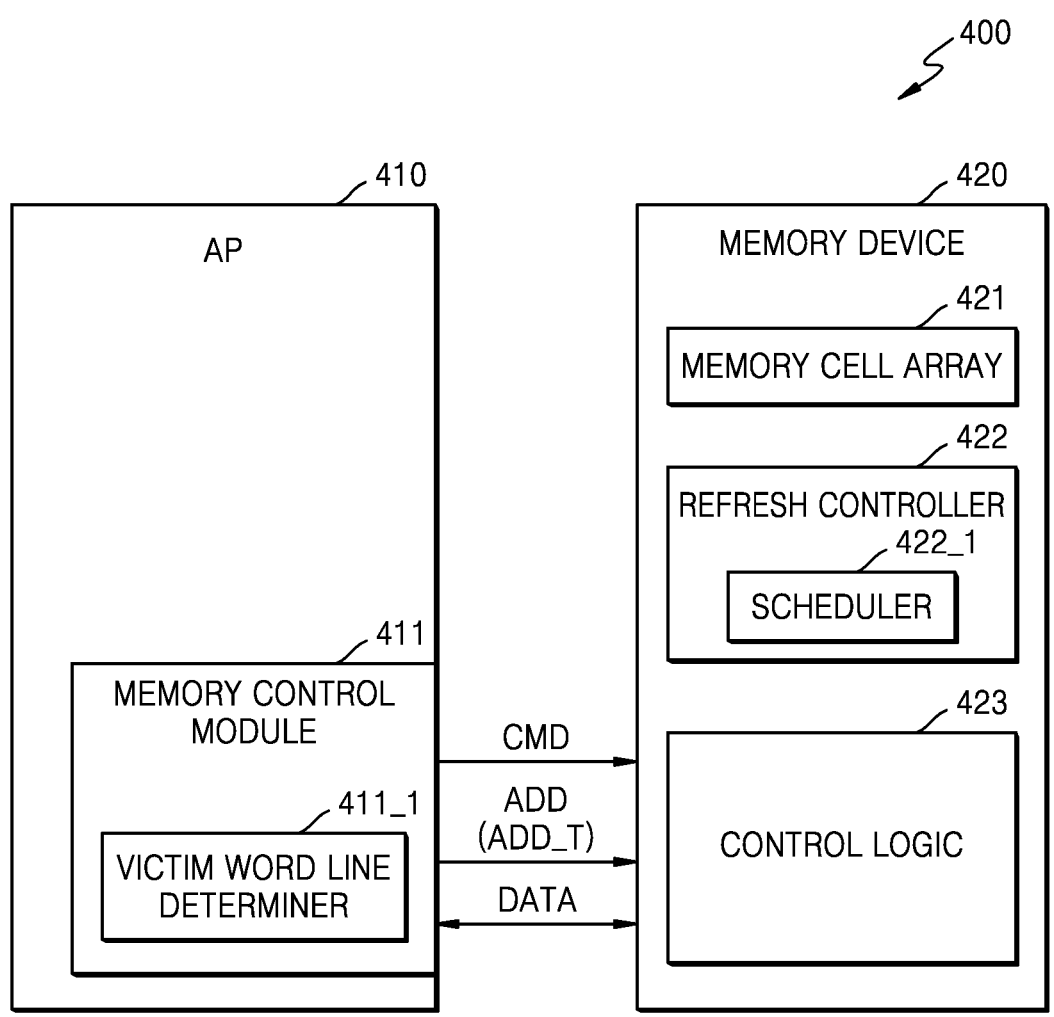
FIG. 11 is a block diagram of a memory system, according to an embodiment.

FIG. 11 is a block diagram of a memory system according to an embodiment. FIG. 11 shows an example of data access DATA between an application processor 410 and a memory device 420, and a memory system 400 may be defined as a concept including the application processor 410 and the memory device 420 or it may be defined that a memory control module 411 in the application processor 410 and the memory device 420 configure the memory system 400. According to the above embodiment, the memory device 420 may include a memory cell array 421, a refresh controller 422, and a control logic 424. The memory system 400 may include or may be similar in many respects to the memory system 10 described above in reference to FIG. 1 and may include additional features not described above. Furthermore, the memory device 420, the control logic 423, the refresh controller 422, and the memory cell array 421 may be similar in many respects to the memory device 200 and 300, the control logic 230 and 310, the refresh controller 220 and 320, and the cell array 210 and 340, respectively, described above in reference to FIGS. 1 and 7, and may include additional features not described above.

The application processor 410 may be implemented as a system on chip (SoC). The SoC may include a system bus (not shown) to which a protocol having a certain standard bus specification is applied, and may include various intellectual processors (IPs) connected to the system bus. The system bus may comply with a standard specification for a system bus, such as, but not limited to, an advanced microcontroller bus architecture (AMBA) protocol of an advanced reduced instruction set computer (RISC). The bus type of the AMBA protocol may include advanced high-performance bus (AHB), advanced peripheral bus (APB), advanced extensible interface (AXI), AXI4, AXI coherence extensions (ACE), and the like. In addition, a different type of protocol such as, but not limited to, uNetwork of SONICs Inc., CoreConnect of IBM, open core protocol of OCP-IP, and the like may be applied.

In an embodiment, at least some control operations related to the refresh operation may be performed at the side of the application processor 410. For example, the memory control module 411 may include a victim word line determiner 411_1. The memory control module 411 may provide the memory device 420 with a command/address CMD/ADD, and accordingly, it may be determined whether to activate the word lines included in the memory device 420, and the victim word line may be determined based on a result of counting the number of activations.

The refresh controller 422 may include a scheduler 422_1, and according to the above embodiments, the normal refresh and the target refresh may be scheduled to be performed together in one refresh section. According to an example, the memory control module 411 may provide the memory device 420 with a target address ADD_T indicating at least one victim word line along with the refresh command, and the memory device 420 may perform the target refresh based on the target address ADD_T from the memory control module 411. For example, the memory device 420 may generate a normal address (not shown) where the normal refresh is to be performed based on an internal counting operation, and may perform the refresh operations to which the embodiments are applied through the scheduling operation using the normal address and the target address ADD_T.

Figure 12:
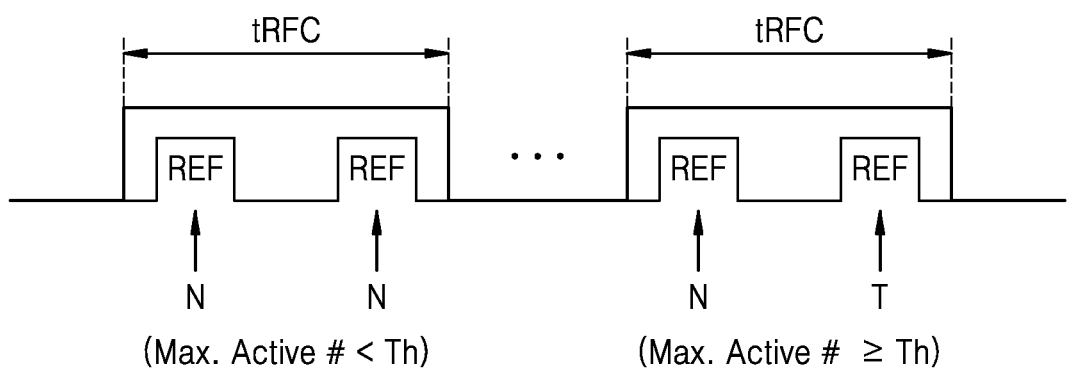
FIG. 12 is a diagram showing an example of an operation in a memory device, according to an embodiment.

FIG. 12 is a diagram showing an example of an operation in a memory device 200, according to another embodiment. FIG. 12 shows an example in which the target refresh is selectively performed based on the number of times of activating the word line that is most frequently activated according to the embodiment.

When the number of times of activating the word line that is most frequently activated within a certain cycle does not exceed a threshold value Th, it may denote that there is no word line to which a large electromagnetic interference is applied, and thus, the target refresh may be skipped. In this case, when the refresh operation is performed twice in the refresh section tRFC responding to one refresh command, only the normal refresh operation N may be successively performed.

Alternatively or additionally, when the number of times of activating the word line that is most frequently activated within a certain cycle exceeds (e.g., is greater than or equal to) the threshold value Th, it denotes that one or more word lines are affected by a large electromagnetic interference, and accordingly, the target refresh may be performed. In this case, when the refresh operation is performed twice in the refresh section tRFC responding to one refresh command, the normal refresh operation N and the target refresh operation T may be sequentially performed.

Figure 13:
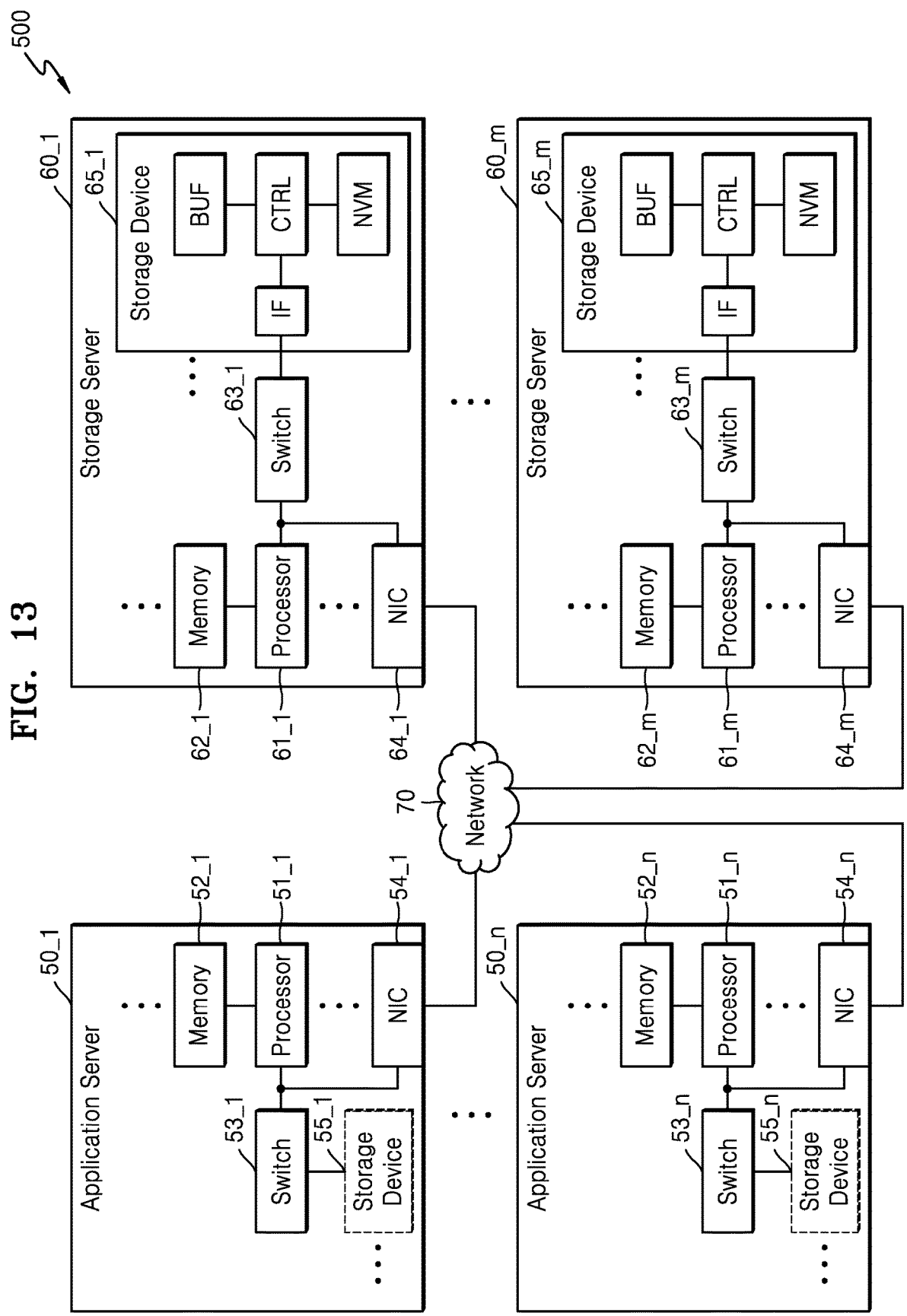
FIG. 13 is a block diagram of a data center including a system, according to an embodiment.

FIG. 13 is a block diagram of a data center 500 including a system, according to an embodiment. In some embodiments, the memory system described above with reference to the drawings may be included in an application server and/or a storage server of the data center 500.

Referring to FIG. 13, the data center 500 may collect various data and provide services, and may be referred to as a data storage center. For example, the data center 500 may include a system for managing a search engine and database, or may include a computing system used in companies such as, but not limited to, banks, and/or government organizations. As shown in FIG. 13, the data center 500 may include application servers 50_1 to 50_$n$ and storage servers 60_1 to 60_$m$ (where m and n are integers greater than or equal to 1). The number n of the application servers 50_1 to 50_$n$ and the number m of storage servers 60_1 to 60_$m$ may be variously selected according to embodiments, and the number n of the application servers 50_1 to 50_$n$ and the number m of the storage servers 60_1 to 60_$m$ may be different from each other.

The application servers 50_1 to 50_$n$ may respectively include at least one from processors 51_1 to 51_$n$, memories 52_1 to 52_$n$, switches 53_1 to 53_$n$, network interface controllers (NICs) 54_1 to 54_$n$, and storage devices 55_1 to 55_$n$. The processors 51_1 to 51_$n$ may control overall operations of the application servers 50_1 to 50_$n$, and may execute instructions and/or data loaded on the memories 52_1 to 52_n by accessing the memories 52_1 to 52_n. The memories 52_1 to 52_n may each include, as a non-limiting example, a double data rate synchronous DRAM (DDR SDRAM), high bandwidth memory (HBM), hybrid memory cube (HMC), dual in-line memory module (DIMM), Optane DIMM, or non-volatile DIMM (NVMDIMM).

According to an embodiment, the number of processors and the number of memories included in the application servers 50_1 to 50_n may be variously selected. In some embodiments, the processors 51_1 to 51_n and the memories 52_1 to 52_n may provide processor-memory pairs. In some embodiments, the number of processors 51_1 to 51_n and the number of memories 52_1 to 52_n may be different. The processors 51_1 to 51_n may each include a single-core processor or a multi-core processor. In some embodiments, as shown in dashed lines in FIG. 13, the storage devices 55_1 to 55_n may be omitted from the application servers 50_1 to 50_n. The number of storage devices 55_1 to 55_n included in the application servers 50_1 to 50_n may be variously selected according to the embodiments. The processors 51_1 to 51_n, the memories 52_1 to 52_n, the switches 53_1 to 53_n, the NICs 54_1 to 54_n, and/or the storage devices 55_1 to 55_n may communicate with one another via the links described above with reference to the drawings.

The storage servers 60_1 to 60_m may respectively include at least one from processors 61_1 to 61_m, memories 62_1 to 62_m, switches 63_1 to 63_m, NICs 64_1 to 64_m, and storage devices 65_1 to 65_m. The processors 61_1 to 61_m and the memories 62_1 to 62_m may operate in a manner similar to the processors 51_1 to 51_n and the memories 52_1 to 52_n in the application servers 50_1 to 50_n described above.

The memories 52_1 to 52_n and the memories 62_1 to 62_m included in the application servers 50_1 to 50_n and the storage servers 60_1 to 60_m may include the memory devices according to the above embodiments. For example, the memories 52_1 to 52_n and 62_1 to 62_m may each include a volatile memory device 200 such as, but not limited to, a DRAM, and when performing the refresh operation on the plurality of word lines, the normal refresh operation and the target refresh operation according to the above embodiments may be performed.

The application servers 50_1 to 50_n and the storage servers 60_1 to 60_m may communicate with one another via a network 70. In some embodiments, the network 70 may be implemented via fibre channel (FC), Ethernet, and the like. FC may be a medium used in relatively high-speed data transmission, and may use an optical switch providing high performance and/or high availability. According to the accessing type of the network 70, the storage servers 60_1 to 60_m may be each provided as a file storage, a block storage, or an object storage.

In some embodiments, the network 70 may include a storage-exclusive network such as, but not limited to, a storage area network (SAN). For example, the SAN may include an FC-SAN that may use the FC network and may be implemented according to FC protocol (FCP). Alternatively or additionally, the SAN may include an IP-SAN that may use transmission control protocol/Internet protocol (TCP/IP) network and may be implemented according to a small computer system interface (SCSI) over TCP/IP or Internet SCSI (iSCSI) protocol. In some embodiments, the network 70 may include a general network such as, but not limited to, a TCP/IP network. For example, the network 70 may be implemented according to a protocol such as, but not limited to, FC over Ethernet (FCoE), network attached storage (NAS), non-volatile memory express (NVMe) over fabrics (NVMe-oF), and the like.

Hereinafter, the application server 50_1 and the storage server 60_1 will be described mainly, but descriptions about the application server 50_1 may be applied to another application server (e.g., 50_n), and the descriptions about the storage server 60_1 may be also applied to another storage server (e.g., 60_m).

The application server 50_1 may store data that is requested to be stored from a user or a client in one of the storage servers 60_1 to 60_m via the network 70. Alternatively or additionally, the application server 50_1 may obtain data that is requested to read from the user or the client from one of the storage servers 60_1 to 60_m via the network 70. For example, the application server 50_1 may be implemented as a web server or a database management system (DBMS).

The application server 50_1 may access the memory 52_n and/or the storage device 55_n included in another application server 50_n via the network 70, and/or may access the memories 62_1 to 62_m and/or the storage devices 65_1 to 65_m included in the storage servers 60_1 to 60_m via the network 70. Accordingly, the application server 50_1 may perform various operations on the data stored in the application servers 50_1 to 50_n and/or the storage servers 60_1 to 60_m. For example, the application server 50_1 may execute an instruction for moving or copying data among the application servers 50_1 to 50_n and/or the storage servers 60_1 to 60_m. Here, the data may be moved from the storage devices 65_1 to 65_m of the storage servers 60_1 to 60_m to the memories 52_1 to 52_n of the application servers 50_1 to 50_n directly or via the memories 62_1 to 62_m of the storage servers 60_1 to 60_m. In some embodiments, the data moved through the network 70 may be encrypted for security or privacy.

In the storage server 60_1, an interface IF may provide a physical connection between the processor 61_1 and the controller CTRL and physical connection between the NIC 64_1 and the controller CTRL. For example, the interface IF may be implemented in a direct attached storage (DAS) type in which the storage device 65_1 is directly accessed via an exclusive cable. Alternatively or additionally, for example, the interface IF may be implemented in various interface types such as, but not limited to, Advanced Technology Attachment (ATA), Serial ATA (SATA), external SATA (e-SATA), SCSI, Serial Attached SCSI (SAS), Peripheral Component Interconnection (PCI), PCI express (PCIe), NVMe, IEEE 1394, universal serial bus (USB), secure digital (SD) card, multi-media card (MMC), embedded multi-media card (eMMC), Universal Flash Storage (UFS), embedded Universal Flash Storage (eUFS), compact flash (CF) card, and the like.

In the storage server 60_1, the switch 63_1 may selectively connect the processor 61_1 and the storage device 65_1 to each other or the NIC 64_1 and the storage device 65_1 to each other according to the control of the processor 61_1.

In some embodiments, the NIC 64_1 may include a network interface card, a network adaptor, and the like. The NIC 64_1 may be connected to the network 70 via a wired interface, a wireless interface, a Bluetooth interface, an optical interface, and the like. The NIC 64_1 may include an internal memory, a DSP, a host bus interface, and the like, and may be connected to the processor 61_1 and/or the switch 63_1 via the host bus interface. In some embodiments, the NIC 64_1 may be integrated with at least one from the processor 61_1, the switch 63_1, and the storage device 65_1.

In the application servers 50_1 to 50_n or the storage servers 60_1 to 60_m, the processors 51_1 to 51_n and 61_1 to 61_m may transmit commands to the storage devices 55_1 to 55_n and 65_1 to 65_m or the memories 52_1 to 52_n and 62_1 to 62_m to program or read the data. Here, the data may be error-corrected data through an error correction code (ECC) engine. The data may be data bus inverted (DBI) data or data masking (DM) processed data, and may include cyclic redundancy code (CRC) information. The data may be encrypted for security or privacy.

The storage devices 55_1 to 55_n and 65_1 to 65_m may transmit control signals and command/address signals to the non-volatile memory device (e.g., a NAND flash memory device, NVM) in response to read commands transmitted from the processors 51_1 to 51_n and 61_1 to 61_m. Accordingly, when the data is read from the non-volatile memory device NVM, a read enable signal may be input as a data output control signal and may function to output data to a DQ bus. A data strobe signal may be generated by using the read enable signal. The command and the address signal may be latched according to a rising edge or a falling edge of a write enable signal.

The controller CTRL may control the overall operations of the storage device 65_1. In an embodiment, the controller CTRL may include a static random access memory (SRAM). The controller CTRL may write data in the non-volatile memory device NVM in response to a write command, or may read data from the non-volatile memory device NVM in response to a read command. For example, the write command and/or the read command may be generated based on a request provided from the host (e.g., the processor 61_1 in the storage server 60_1, the processor 61_m in another storage server 60_m, or the processors 51_1 to 51_n in the application servers 50_1 to 50_n). A buffer BUF may temporarily store (buffer) the data to be written in the non-volatile memory device NVM or the data read from the non-volatile memory device NVM. In some embodiments, the buffer BUF may include a DRAM. Alternatively or additionally, the buffer BUF may store metadata, and the metadata may indicate user data or data generated by the controller CTRL for managing the non-volatile memory device NVM. The storage device 65_1 may include a secure element (SE) for security or privacy issue.

While the present disclosure has been particularly shown and described with reference to embodiments thereof, it will be understood that various changes in form and details may be made therein without departing from the spirit and scope of the following claims.

What is claimed is:

1. An operating method of a memory device, comprising:
    performing, at a first refresh timing in response to reception of a first refresh command, a first normal refresh in which first N word lines, from among a plurality of word lines of the memory device, are simultaneously refreshed, N being an integer greater than 1;
    performing, at a second refresh timing in response to the reception of the first refresh command, a first target refresh on at least one first victim word line that is adjacent to a most-frequently activated word line from among the plurality of word lines;
    performing, at a third refresh timing in response to reception of a second refresh command, a second normal refresh in which second N word lines, from among the plurality of word lines, are simultaneously refreshed; and
    performing, at a fourth refresh timing in response to the reception of the second refresh command, a second target refresh on at least one second victim word line that is adjacent to the most-frequently activated word line.

2. The operating method of claim 1, wherein the at least one first victim word line comprises a word line that is closest to a side of the most-frequently activated word line, and the at least one second victim word line comprises a word line that is closest to another side of the most-frequently activated word line.

3. The operating method of claim 1, wherein the at least one first victim word line comprises at least two word lines that are adjacent to a side of the most-frequently activated word line, and the at least one second victim word line comprises another at least two word lines that are adjacent to another side of the most-frequently activated word line.

4. The operating method of claim 1, wherein the most-frequently activated word line corresponds to the most frequently activated word line from among the plurality of word lines in a time interval in which two refresh commands are received.

5. The operating method of claim 1, wherein
    the performing of the first normal refresh comprises simultaneously refreshing the first N word lines in a first bank of the memory device, and
    the performing of the first target refresh on the at least one first victim word line comprises performing the first target refresh on the at least one first victim word line in a second bank of the memory device.

6. The operating method of claim 5, wherein
    the performing of the second normal refresh comprises performing the second normal refresh on the second N word lines in the second bank of the memory device, and
    the performing of the second target refresh on the at least one second victim word line comprises performing the second target refresh on the at least one second victim word line in the first bank of the memory device.

7. The operating method of claim 1, wherein
    a refresh section corresponds to a time interval in which refresh operations are performed in response to the reception of the first refresh command,
    the performing of the first normal refresh comprises performing the first normal refresh in the refresh section, and
    the performing of the first target refresh comprises performing the first target refresh in the refresh section.

8. The operating method of claim 1, wherein
    the performing of the first normal refresh comprises simultaneously refreshing the first N word lines, N being a multiple of 4, and
    the performing of the first target refresh comprises performing the first target refresh on one first victim word line.

9. A memory device, comprising:
    a memory cell array including a plurality of word lines;
    a refresh controller configured to control refresh operations on the plurality of word lines, and perform scheduling of a normal refresh operation and a target refresh operation on the plurality of word lines; and
    a control logic configured to determine at least one victim word line on which the target refresh operation is to be performed, based on counting a number of activation times of the plurality of word lines, wherein the refresh controller is further configured to perform scheduling so that the normal refresh operation and the target refresh operation are performed together in a refresh section that corresponds to reception of one refresh command, and wherein a first number of word lines that are simultaneously refreshed by the normal refresh operation is greater than a second number of word lines that are refreshed by the target refresh operation.

10. The memory device of claim 9, wherein
the refresh controller is further configured to perform N-series refresh in the refresh section comprising N refresh timings that corresponds to the reception of the refresh command, wherein N is an integer greater than 1, and a first number of normal refresh operations performed in the refresh section matches a second number of target refresh operations performed in the refresh section.

11. The memory device of claim 9, wherein performing the target refresh operation in the refresh section, comprises to refresh the at least one victim word line that is adjacent to a side of a word line that is most frequently activated in a certain time period.

12. The memory device of claim 11, wherein the refresh controller is further configured to perform a next target refresh operation on another at least one victim word line adjacent to another side of the word line that is most frequently activated in the certain time period, wherein the next target refresh operation is scheduled in a next refresh section corresponding to a next refresh command.

13. The memory device of claim 9, wherein the refresh controller is further configured to:
generate a normal address indicating the first number of word lines that are to be refreshed by the normal refresh operation;
receive, from the control logic, a target address indicating the at least one victim word line;
output the normal address at a first timing of performing the normal refresh operation; and
output the target address at a second timing of performing the target refresh operation.

14. The memory device of claim 9, wherein
the memory cell array includes a first bank and a second bank,
the refresh section includes a first refresh timing and a second refresh timing,
to perform scheduling of the normal refresh operation comprises to schedule the normal refresh operation to perform, in the first refresh timing, the normal refresh operation on a first plurality of word lines in the first bank, and
to perform scheduling of the target refresh operation comprises to schedule the target refresh operation to perform, in the first refresh timing, the target refresh operation on the at least one victim word line in the second bank.

15. The memory device of claim 14, wherein the refresh controller is further configured to:

perform, in the second refresh timing, another target refresh operation on another at least one victim word line in the first bank, and perform, in the second refresh timing, another normal refresh operation on a second plurality of word lines in the second bank.

16. The memory device of claim 9, wherein the at least one victim word line is adjacent to a word line that is most frequently activated in a time interval in which two refresh commands are received.

17. A memory system, comprising:
a memory device including a memory cell array including a plurality of word lines, and a refresh controller configured to control refresh operations on the plurality of word lines, and schedule a normal refresh operation of the plurality of word lines and a target refresh operation of at least one victim word line; and a memory controller configured to provide the memory device with a command and an address and control access to the memory device, wherein the memory device is configured to perform a scheduling so that the normal refresh operation and the target refresh operation are performed together in a refresh section that corresponds to reception of a refresh command from the memory controller, and wherein a first number of word lines that are simultaneously refreshed by the normal refresh operation is greater than a second number of word lines that are refreshed by the target refresh operation.

18. The memory system of claim 17, wherein the memory device is further configured to perform the normal refresh operation and the target refresh operation in the refresh section that corresponds to the reception of the refresh command.

19. The memory system of claim 18, wherein
the at least one victim word line includes a first victim word line and a second victim word line that are adjacent to opposite sides of a word line that is most frequently activated in a timing interval,
to perform the target refresh operation in the refresh section comprises to perform the target refresh operation on the first victim word line, and
the memory device is further configured to perform a next target refresh operation on the second victim word line in a next refresh section corresponding to a reception of a next refresh command.

20. The memory system of claim 18, wherein the memory controller is further configured to:
determine the at least one victim word line based on counting a number of activation times of the plurality of word lines in the memory device, and
transmit, to the memory device, the refresh command comprising a target address indicating the at least one victim word line.

* * * * *